United States Patent
Masuda

(10) Patent No.: US 8,907,696 B2
(45) Date of Patent: Dec. 9, 2014

(54) TEST APPARATUS HAVING OPTICAL INTERFACE AND TEST METHOD

(75) Inventor: Shin Masuda, Miyagi (JP)

(73) Assignee: Advantest Corporation, Tokyo (JP)

( * ) Notice: Subject to any disclaimer, the term of this patent is extended or adjusted under 35 U.S.C. 154(b) by 584 days.

(21) Appl. No.: 13/038,344

(22) Filed: Mar. 1, 2011

(65) Prior Publication Data

US 2011/0279109 A1 Nov. 17, 2011

(30) Foreign Application Priority Data

May 17, 2010 (JP) .................................. 2010-113315

(51) Int. Cl.
| | |
|---|---|
| *G01R 31/28* | (2006.01) |
| *G01R 31/311* | (2006.01) |
| *G01R 31/319* | (2006.01) |
| *G01R 31/317* | (2006.01) |
| *G01R 31/302* | (2006.01) |

(52) U.S. Cl.
CPC .... *G01R 31/31917* (2013.01); *G01R 31/31728* (2013.01); *G01R 31/3025* (2013.01); *G01R 31/2889* (2013.01)
USPC ............ 324/762.01; 324/750.23; 324/754.03; 324/754.23; 324/756.03

(58) Field of Classification Search
CPC ................. G01R 31/31917; G01R 31/31926; G01R 31/2899; G01R 31/31905; G01R 31/3025; G01R 31/311; G01R 31/2656; G01R 31/31728; G01R 1/071
USPC ............. 324/750.16, 750.23, 754.21, 754.23, 324/96, 754.03, 754.07, 756.03, 762.01
See application file for complete search history.

(56) References Cited

U.S. PATENT DOCUMENTS

| | | | | |
|---|---|---|---|---|
| 5,179,420 | A | * | 1/1993 | So et al. ..................... 356/73.1 |
| 5,933,227 | A | * | 8/1999 | Furuhashi ................. 356/73.1 |
| 6,067,150 | A | * | 5/2000 | Beller et al. ............... 356/73.1 |
| 6,678,055 | B2 | * | 1/2004 | Du-Nour et al. ........... 356/504 |
| 6,697,548 | B2 | * | 2/2004 | LoCascio et al. ........... 385/16 |

(Continued)

FOREIGN PATENT DOCUMENTS

| | | |
|---|---|---|
| JP | 61-241673 | 10/1986 |
| JP | 2001-042004 | 2/2001 |

(Continued)

OTHER PUBLICATIONS

KR Office Action/Search Report and Partial Translation Dated Sep. 17, 2012; Application No. 1020110106401.

(Continued)

*Primary Examiner* — Huy Q Phan
*Assistant Examiner* — James Split

(57) ABSTRACT

There is provided a test apparatus for testing a device under test, including a test signal generator that generates a test signal to test the device under test, an electric-photo converter that converts the test signal into an optical test signal, an optical interface that (i) transmits the optical test signal generated by the electric-photo converter to an optical receiver of the device under test and (ii) receives and outputs an optical response signal output from the device under test, a photoelectric converter that converts the optical response signal output from the optical interface into an electrical response signal and transmits the electrical response signal, and a signal receiver that receives the response signal transmitted from the photo-electric converter and a test method.

17 Claims, 6 Drawing Sheets

(56) References Cited

U.S. PATENT DOCUMENTS

| | | | |
|---|---|---|---|
| 7,024,066 B1* | 4/2006 | Malendevich et al. | 385/14 |
| 7,109,739 B2* | 9/2006 | Gothoskar et al. | 324/754.23 |
| 7,129,722 B1* | 10/2006 | Brophy et al. | 324/750.25 |
| 7,173,551 B2* | 2/2007 | Vrazel et al. | 341/144 |
| 7,183,759 B1* | 2/2007 | Malendevich et al. | 324/750.22 |
| 7,184,626 B1* | 2/2007 | Gunn et al. | 385/37 |
| 7,224,174 B1* | 5/2007 | Malendevich et al. | 324/750.23 |
| 7,262,852 B1* | 8/2007 | Gunn et al. | 356/401 |
| 7,298,939 B1* | 11/2007 | Malendevich et al. | 385/31 |
| 7,313,496 B2* | 12/2007 | Ishida et al. | 702/111 |
| 7,348,786 B2* | 3/2008 | Thacker et al. | 324/755.07 |
| 7,359,644 B2* | 4/2008 | Chown | 398/136 |
| 7,378,861 B1* | 5/2008 | Malendevich et al. | 324/750.23 |
| 7,412,138 B1* | 8/2008 | Malendevich et al. | 385/52 |
| 7,586,608 B1* | 9/2009 | Gunn et al. | 356/399 |
| 2002/0024670 A1* | 2/2002 | Ema | 356/399 |
| 2003/0098704 A1* | 5/2003 | Du-Nour et al. | 324/765 |
| 2006/0184332 A1 | 8/2006 | Ishida et al. | |
| 2008/0118202 A1 | 5/2008 | Kato et al. | |
| 2008/0189585 A1* | 8/2008 | Sato | 714/738 |

FOREIGN PATENT DOCUMENTS

| | | | | |
|---|---|---|---|---|
| JP | 2005055301 | | 3/2005 | |
| JP | 2005055301 A | * | 3/2005 | G01R 31/28 |
| JP | 2006-220660 A | | 8/2006 | |
| JP | 2008116420 A | * | 5/2008 | |
| JP | 2008249623 A | * | 10/2008 | |
| JP | 2009019933 | | 1/2009 | |
| JP | 2009-085764 | | 4/2009 | |
| JP | 2009085764 A | * | 4/2009 | |
| JP | 2009-116034 | | 5/2009 | |
| JP | 2010019895 | | 1/2010 | |
| WO | 03071297 | | 8/2003 | |
| WO | 2007/013128 A1 | | 2/2007 | |

OTHER PUBLICATIONS

Young et al., "Optical I/O Technology for Tera-Scale Computing", IEEE Journal of Solid-State Circuits, Jan. 2010, vol. 45, No. 1, pp. 235-248.

Thacker et al., "Prospects for Wafer-Level Testing of Gigascale Chips with Electrical and Optical I/O Interconnects", IEEE International Test Conference, 2006, Paper 25-1, pp. 1-7.

Applicant brings the attention of the Examiner to the following pending U.S. applications; U.S. Appl. No. 13/040,161, filed Mar. 3, 2011 and U.S. Appl. No. 13/041,294, filed Mar. 4, 2011.

KR Office Action/ Search Report and Computer Translation Dated Mar. 25, 2013; Application No. 10-2011-0106401.

JP Office Action/ Search Report and Computer Translation Dated Oct. 1, 2013; Application No. 2010-113315.

TW Office Action/ Search Report and Computer Translation Dated Oct. 14, 2013; Application No. 10221378680.

JP Office Action/Search Report and English Translation dated Aug. 5, 2014; Application No. 2010-113315.

* cited by examiner

TEST APPARATUS HAVING OPTICAL INTERFACE AND TEST METHOD

BACKGROUND

1. Technical Field

The present invention relates to a test apparatus and a test method.

2. Related Art

A test apparatus has been conventionally designed to test a device under test such as a CPU and a memory. A loopback test has been proposed that is used to test a device under test at an actual operation speed, for example, as disclosed in Patent Document 1. It has been also proposed to provide a device under test with an optical interface, for example, as disclosed in Patent Document 2.

Patent Document 1: Japanese Patent Application Publication No. 2006-220660

Patent Document 2: International Publication No. 2007-013128

Non-Patent Document 1: Ian A. Young, et al., "Optical I/O Technology for Tera-Scale Computing", IEEE Journal of Solid-State Circuits, January 2010, Vol. 45, No. 1, pp. 235-248

Non-Patent Document 2: Hiren D. Thacker, James D. Meindl, "Prospects for Wafer-Level Testing of Gigascale Chips with Electrical and Optical I/O Interconnects", IEEE International Test Conference, 2006, 25-1

To test such a device under test with an optical interface, a test apparatus is required to use an optical signal as a test signal and detect an optical response signal. Accordingly, the test apparatus needs to have a photometer for use in optical communication. This, however, lowers the throughput and thus increases the testing cost.

SUMMARY

Therefore, it is an object of an aspect of the innovations herein to provide a test apparatus and a test method, which are capable of overcoming the above drawbacks accompanying the related art. The above and other objects can be achieved by combinations described in the claims. A first aspect of the innovations may include a test apparatus for testing a device under test, including a test signal generator that generates a test signal to test the device under test, an electric-photo converter that converts the test signal into an optical test signal, an optical interface that (i) transmits the optical test signal generated by the electric-photo converter to an optical receiver of the device under test and (ii) receives and outputs an optical response signal output from the device under test, a photo-electric converter that converts the optical response signal output from the optical interface into an electrical response signal and transmits the electrical response signal, and a signal receiver that receives the response signal transmitted from the photo-electric converter, and a test method.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
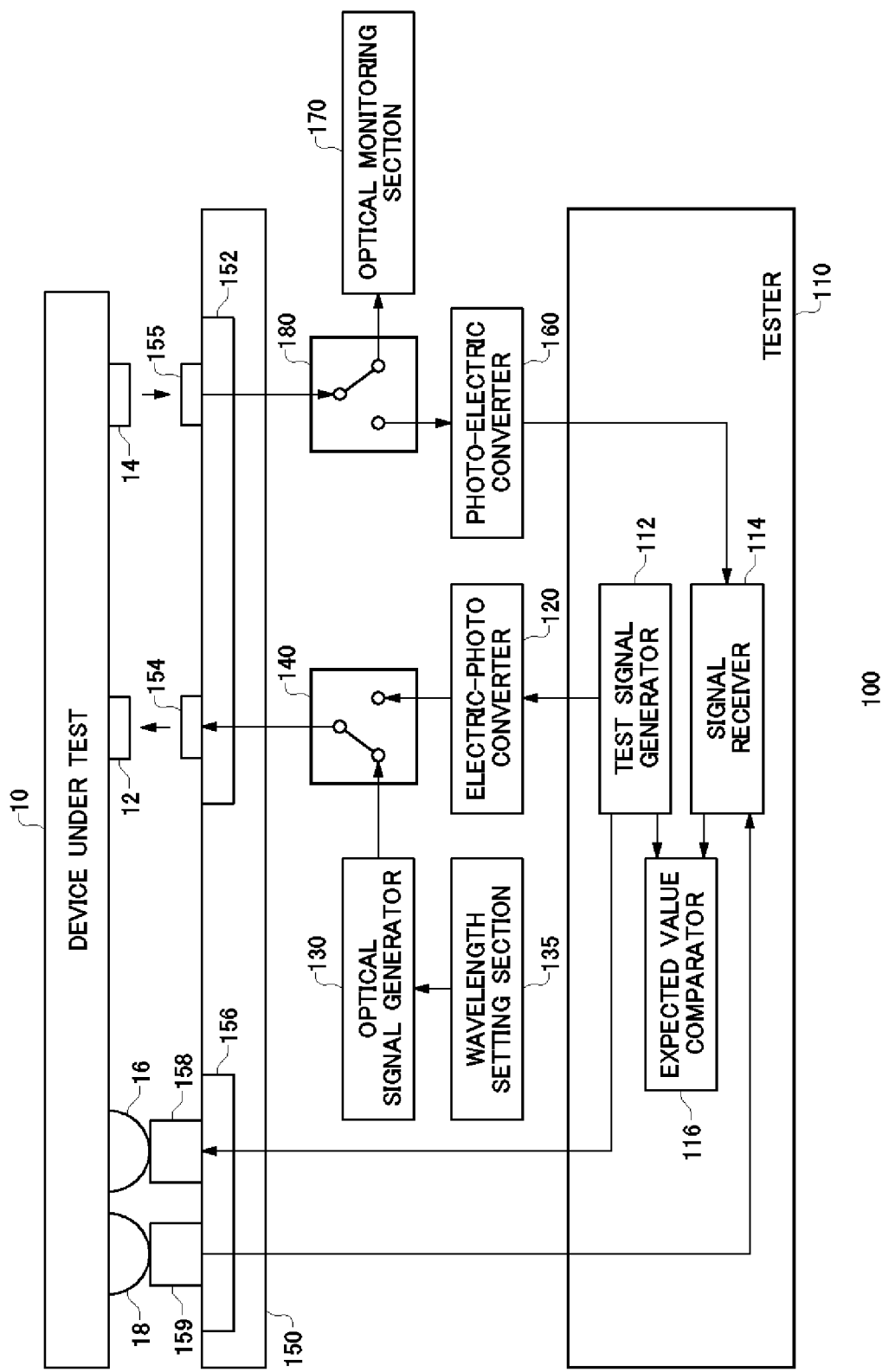
FIG. 1 illustrates an exemplary configuration of a test apparatus 100 relating to an embodiment of the present invention, together with a device under test 10.

FIG. 1 illustrates an exemplary configuration of a test apparatus 100 relating to an embodiment of the present invention, together with a device under test 10. The test apparatus 100 tests the device under test 10. The device under test 10 may be a circuit having a combination of at least one of an analog circuit, a digital circuit, a memory and a system on chip (SOC) and includes an optical interface. The device under test 10 has one or more optical receivers 12 and one or more optical transmitters 14 for exchanging optical signals. The device under test 10 may include one or more input terminals 16 and one or more output terminals 18 for exchanging electrical signals. Here, the input and output terminals 16 and 18 may be solder humps, lands, connectors or the like.

The test apparatus 100 is designed to supply to the optical receiver 12 of the device under test 10 an optical test signal generated through electric-photo conversion of an electrical test signal, and to receive an optical response signal output from the optical transmitter 14 of the device under test 10, perform photo-electric conversion on the optical response signal to generate an electrical response signal, compare the value of the electrical response signal against an expected value and judge whether the device under test 10 is acceptable based on the result of the comparison. The test apparatus 100 may also be designed to supply a test signal to the input terminal 16 of the device under test 10, and to receive a response signal output from the output terminal 18 of the device under test 10, compare the value of the response signal against an expected value and judge whether the device under test 10 is acceptable based on the result of the comparison. The test apparatus 100 includes a tester 110, an electric-photo converter 120, an optical signal generator 130, a wavelength setting section 135, a first optical switch 140, a device interface 150, a photo-electric converter 160, an optical monitoring section 170, and a second optical switch 180.

The tester 110 is designed to output a test signal, and to receive a response signal output in response to the test signal and compare the value of the response signal against an expected value. For example, the tester 110 outputs a test signal by acquiring a test program used for a test from a storage device or an external computer such as a workstation, or through a user's input and executing the obtained test program. The tester 110 may display a test result for a user or forward and store a test result to/on an external computer or a storage device. Here, the test result is a result of the comparison. The tester 110 includes a test signal generator 112, a signal receiver 114, an expected value comparator 116.

The test signal generator 112 generates a test signal used to test the device under test 10. For example, the test signal generator 112 generates a test signal based on test pattern data, a test sequence or the like provided by a test program. The test signal generator 112 generates a test signal used to test an optical signal. Here, the test signal generator 112 may generate a test signal used to test an electrical signal of the device under test 10. For example, the test signal generator 112 generates an expected value of a response signal that is expected to be output from the device under test 10 in response to the test signal, and sends the expected value to the expected value comparator 116.

The signal receiver 114 receives an electrical signal generated by converting an optical response signal output from the device under test. Here, the signal receiver 114 may receive, via the device interface 150, a response signal output from the device under test in response to a test. The signal receiver 114 sends the received signal to the expected value comparator 116.

The expected value comparator 116 compares the received signal received by the signal receiver 114 against an expected value. The expected value comparator 116 receives the expected value from the test signal generator 112. The test apparatus 100 may judge whether the device under test 10 is acceptable based on the result of the comparison done by the expected value comparator 116.

The electric-photo converter 120 converts a test signal into an optical test signal. For example, the electric-photo converter 120 generates the optical test signal by driving an LED, a laser or the like in accordance with the test signal. Alternatively, the electric-photo converter 120 may generate the optical test signal by modulating light emitted from an LED, a laser or the like with the test signal. The electric-photo converter 120 may also transmit the generated optical test signal through an optical transmission path such as an optical fiber or optical waveguide.

The optical signal generator 130 generates an optical signal and transmits the optical signal to the device under test 10 through a different path than the electric-photo converter 120. For example, the optical signal generator 130 outputs continuous light (CW light) with a constant intensity from an LED or laser. The optical signal generator 130 may be a variable wavelength light source that can vary the wavelength of the light output therefrom. The wavelength of the light output from the optical signal generator 130 is controlled by the wavelength setting section 135. The wavelength setting section 135 sets the wavelength of the light to be output from the variable wavelength light source, in accordance with the wavelength of the optical signal to be received by the device under test 10.

The first optical switch 140 receives the optical signals output from the optical signal generator 130 and the electric-photo converter 120, selects one of the optical signals, and allows the selected optical signal to be input into the optical interface 152. For example, the first optical switch 140 may be a waveguide switch that switches the transmission paths based on a combination of a waveguide structure and a change in refractive index caused by an external input such as heat, light or electrical power. Alternatively, the first optical switch 140 may be a Mach-Zehnder optical switch that applies an electric field or the like to one of the two branched optical waveguides to change the phase of the optical signal passing through the selected optical waveguide and then multiplexes the phase-changed optical signal with the optical signal of the other optical waveguide.

Alternatively, the first optical switch 140 may switch from an optical fiber being used for transmission to a different optical fiber to be used for transmission by driving the optical fibers using an electromagnetic actuator or the like Alternatively, the first optical switch 140 may switch the optical transmission path of a light beam enlarged by a lens or the like to a desired optical transmission path by manipulating a prism or mirror. Alternatively, the first optical switch 140 may switch the optical transmission path of a light beam propagating through a space by inserting into the light beam a micron-size mirror or shutter obtained by using the Micro Electro Mechanical Systems (MEMS) technique.

The device interface 150 is configured to have the device under test 10 loaded thereon. For example, the device interface 150 attracts and secures the device under test 10 by suction. The device interface 150 includes an optical interface 152. The device interface 150 may also include an electrical interface 156 when the test apparatus 100 performs a test on the device under test 10 by exchanging electrical signals with the device under test 10.

The optical interface 152 is configured to transmit the optical test signal generated by the electric-photo converter 120 to the optical receiver of the device under test 10 and to receive and output the optical response signal output from the device under test 10. The optical interface 152 may transmit the optical signal generated by the optical signal generator 130 to the optical receivers of the device under test 10 as a result of the switching operation of the first optical switch 140. For example, the optical interface 152 receives an optical signal through an optical transmission path from the first optical switch 140 and outputs the optical signal through an optical transmission path to the optical monitoring section 170. For example, the optical interface 152 includes one or more optical transmitters 154 the number of which is equal to or larger than the number of the optical receivers 12 of the device under test 10 and one or more optical receivers 155 the number of which is equal to or larger than the number of optical transmitters 14 of the device under test 10.

The optical transmitter 154 outputs an optical signal to the device under test 10. For example, the optical transmitter 154 uses a lens, a prism, and/or a mirror to output an optical signal in the form of a light beam that propagates through a space. Alternatively, the optical transmitter 154 may pass an optical signal to the optical receiver 12 by positioning the output end of the optical transmission path in the vicinity of the optical receiver 12 of the device under test 10 or so that the output end comes into contact with the optical receiver 12. Here, the optical transmitter 154 may include a collimating lens at the output end of the optical transmission path.

The optical receiver 155 receives an optical response signal from the device under test 10. Similarly to the optical transmitter 154, the optical receiver 155 may use a lens, a prism, and/or a mirror to receive an optical signal, or may alternatively receive an optical response signal by positioning the input end of the optical transmission path in the vicinity of the optical transmitter 14 of the device under test 10 or so that the input end comes into contact with the optical transmitter 14.

The electrical interface 156 establishes electrical connection with the device under test 10 to exchange electrical signals. The electrical interface 156 is configured to receive a test signal from the test signal generator 112 and supply the received test signal to the device under test 10, and to receive a response signal output from the device under test 10 in response to a test signal and send the received response signal to the signal receiver 114. The electrical interface 156 may supply to the device under test 10 a clock signal and/or a power that has a lower frequency than an optical test signal.

For example, the electrical interface 156 includes one or more output terminals 158 the number of which is equal to or larger than the number of the input terminals 16 of the device under test 10 and one or more input terminals 159 the number of which is equal to or larger than the number of the output terminals 18 of the device under test 10.

The output terminal 158 may be a terminal, a probe, a cantilever or a membrane bump that is brought into direct contact with the input terminal 16. The output terminal 158 may be a connector that is adapted to fit with the input terminal 16, when the input terminal 16 is a connector. Similarly to the output terminal 158, the input terminal 159 may be a terminal, a probe, a cantilever, a membrane bump, or a connector that is brought into direct contact with the output terminal 18.

The photo-electric converter 160 converts the optical response signal output from the optical interface 152 into an electrical response signal and sends the electrical response signal to the signal receiver 114. For example, the photo-electric converter 160 uses a photodiode to convert the optical response signal into the response signal. Alternatively, the photo-electric converter 160 may be an image sensor such as a CCD. In this case, the photo-electric converter 160 may receive a plurality of optical response signals through a plurality of optical transmission paths and convert the plurality of optical response signals into a plurality of response signals.

The optical monitoring section 170 converts an optical signal input thereto into an electrical signal and monitors the signal. For example, the optical monitoring section 170 uses a photodiode to convert an optical signal into an electrical signal. Alternatively, the optical monitoring section 170 may be an image sensor such as a CCD. In this case, the optical monitoring section 170 may receive a plurality of optical signals through a plurality of optical transmission paths and convert the plurality of optical signals into a plurality of electrical signals.

The second optical switch 180 selects one of the optical monitoring section 170 and the photo-electric converter 160 and allows the optical response signal output from the optical interface 152 to be input into the selected one of the optical monitoring section 170 and the photo-electric converter 160. Similarly to the first optical switch 140, the second optical switch 180 may be a waveguide, mechanical or MEMS optical switch.

Figure 2:
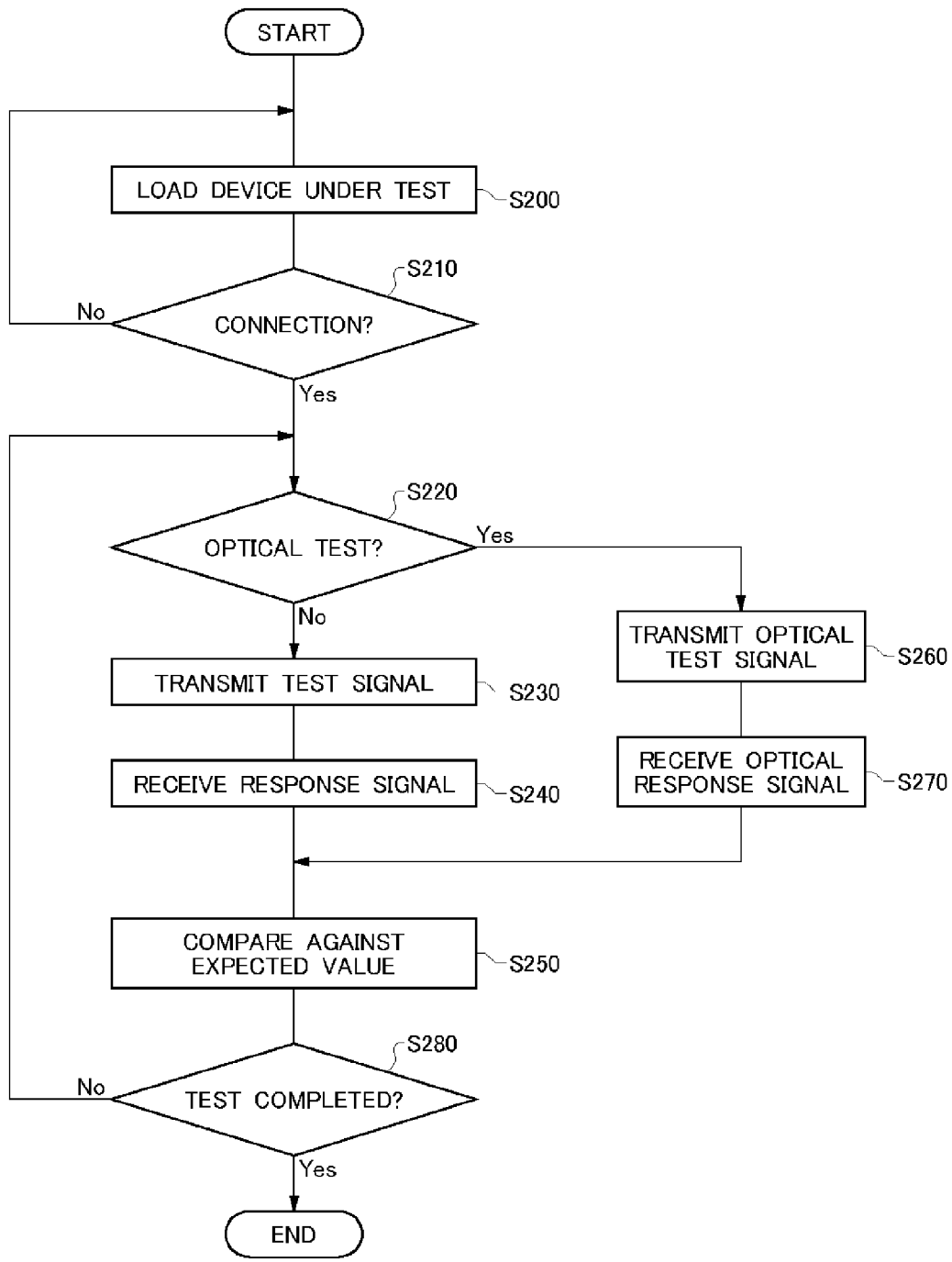
FIG. 2 is a flow chart to illustrate the operations of the test apparatus 100 relating to the embodiment.

FIG. 2 is a flow chart to illustrate the operations of the test apparatus 100 relating to the embodiment. The device under test 10 is loaded onto the device interface 150 of the test apparatus 100 (step S200). For example, the device under test 10, which is a package, a wafer, or a chip, is loaded onto the test apparatus 100. For example, the device under test 10 is temporarily secured to an XYZθ stage that moves in at least three different directions and rotates, and loaded onto the device interface 150 of the test apparatus 100 by controlling the position of the XYZθ stage.

After this, the test apparatus 100 examines whether there is connection between the device under test 10 and the device interface 150 (step S210). The test apparatus 100 examines whether optical signals are connected between the optical interface 152 and the optical receivers and transmitters 12 and 14 of the device under test 10. To do so, the first optical switch 140 selects the optical signal output from the optical signal generator 130 and allows the selected optical signal to be input into the optical interface 152, and the second optical switch 180 selects the optical monitoring section 170 and allows the optical response signal output from the optical interface 152 to be input into the selected optical monitoring section 170. The test apparatus 100 then detects whether there is connection between the device under test 10 and the optical interface 152 based on the result of the monitoring done by the optical monitoring section 170 and starts testing the device under test 10 in response to the detection of the connection.

The optical signal generator 130 may generate CW light having a predetermined intensity and supply the generated CW light to the device under test 10 in order to detect whether there is connection between the device under test 10 and the optical interface 152. The optical monitoring section 170 detects that there is connection between the device under test 10 and the optical interface 152 when the monitoring result indicates CW light whose intensity falls within a predetermined range.

When the device under test 10 has a plurality of optical receivers 12 and a plurality of optical transmitters 14, the first optical switch 140 of the test apparatus 100 may include an optical switch that branches a single optical signal generated by a single optical signal generator 130 into a plurality of optical transmission paths and the optical interface 152 may input the optical signals transmitted through the optical transmission paths respectively into the optical receivers 12. Alternatively, the test apparatus 100 may include a plurality of optical signal generators 130 to generate a plurality of optical signals and transmit the optical signals through a plurality of optical transmission paths, and the optical interface 152 may input the optical signals transmitted through the optical transmission paths respectively into the optical receivers 12.

The optical interface 152 receives a plurality of optical response signals output from the plurality of optical transmitters 14 through a plurality of optical transmission paths and passes the received optical response signals to the second optical switch 180. The second optical switch 180 selects the optical monitoring section 170 and switches between the plurality of optical transmission paths in synchronization with the switching timing of the first optical switch 140 so that the single optical monitoring section 170 can sequentially monitor the plurality of optical response signals. In this way, a single set of an optical signal generator 130 and an optical monitoring section 170 can be sufficient to detect whether there is connection between the optical interface 152 and the plurality of optical receivers 12 and the plurality of optical transmitters 14.

Alternatively, the test apparatus 100 may include a plurality of optical monitoring sections 170 and may detect whether there is connection between the optical interface 152 and the optical receivers and transmitters 12 and 14 with the second optical switch 180 requiring fewer or no switching operations. Alternatively, the test apparatus 100 may include a plurality of optical monitoring sections 170 and a plurality of optical signal generators 130, and may detect whether there is connection between the optical interface 152 and the optical receivers and transmitters 12 and 14 with the first and second optical switches 140 and 180 requiring fewer or no switching operations.

In the test apparatus 100, one or more optical signals generated by one or more optical signal generators 130 may branch into a plurality of optical transmission paths. In this case, the test apparatus 100 may use the same number of optical monitoring sections 170 as a plurality of optical response signals output from the optical interface 152 to separately monitor the plurality of optical response signals. In this way, the test apparatus 100 can simultaneously detect whether connection exists between the optical interface 152 and the plurality of optical receivers 12 and the plurality of optical transmitters 14. When the test apparatus 100 cannot detect connection between the optical interface 152 and the device under test 10, the flow goes back to the step S200 and the device under test 10 is reloaded.

The test apparatus 100 may judge that the device under test 10 is defective when no connection can be detected after multiple attempts of loading the device under test 10. For example, the test apparatus 100 judges that the optical receiver 12 and/or transmitter 14 of the device under test 10 is defective when no connection can be detected after a predetermined number of attempts of loading the device under test 10.

The test apparatus 100 may detect transmission characteristics of the optical components provided within the device under test 10. The device under test 10 includes therein optical components such as a WDM multiplexer/splitter and an optical filter, for example, to multiplex or split therein the light received through the optical receiver 12 depending on the wavelength of the received light. The test apparatus 100 varies the wavelength of the optical signal generated by the optical signal generator 130 using the wavelength setting section 135 and supplies the resulting optical signal to the optical receiver 12, and receives the optical response signal from the optical transmitter 14 and monitors the optical response signal by the optical monitoring section 170. In this way, the test apparatus 100 can monitor how much the optical response signal of the device under test 10 depend on the wavelength of the input optical signal, and thus can detect the transmission characteristics of the optical components provided within the device under test 10.

The test apparatus 100 detects whether electrical signals are connected between the device under test 10 and the electrical interface 156 once connection is detected between the device under test 10 and the optical interface 152. The test apparatus 100 supplies a predetermined electrical signal, that is to say, for example, an electrical signal having a predetermined logic value such as HIGH/LOW or an electrical signal having a predetermined pattern, from the test signal generator 112 to the input terminal 16 through the output terminal 158. The test apparatus 100 subsequently receives by the signal receiver 114 a response signal output from the output terminal 18 through the input terminal 159 and detects whether electrical signals are connected.

In the test apparatus 100, for example, the test signal generator 112 supplies a constant voltage as the predetermined electrical signal, and the signal receiver 114 detects that there is connection in response to receiving a voltage within a predetermined range. The test apparatus 100 may judge that normal connection can be established between the device under test 10 and the device interface 150 when detecting that there is connection between the device under test 10 and the electrical interface 156. When the test apparatus 100 detects no connection between the device under test 10 and the electrical interface 156, the flow goes back to the step S200 and the device under test 10 is reloaded.

The test apparatus 100 may judge that the device under test 10 is defective when no connection can be detected after multiple attempts of loading the device under test 10. For example, the test apparatus 100 judges that the input terminal 16 and/or the output terminal 18 of the device under test 10 is defective when no connection can be detected after a predetermined number of attempts of loading the device under test 10.

The test apparatus 100 starts testing the device under test 10 once normal connection is detected between the device under test 10 and the device interface 150. The test apparatus 100 determines whether an optical or electrical test should be performed (step S220). For example, the test apparatus 100 determines whether to perform an optical test by referring to a test program, a test sequence, or a control command.

When judging that an electrical test is to be performed, the test apparatus 100 supplies the test signal generated by the test signal generator 112 to the input terminal 16 through the output terminal 158 (step S230). Here, the test signal generator 112 sends to the expected value comparator 116 the expected value corresponding to the supplied test signal. The test apparatus 100 receives the response signal output from the output terminal 18 of the device under test 10 in response to the supplied test signal, at the signal receiver 114 through the input terminals 159 (step S240). The signal receiver 114 sends the received response signal to the expected value comparator 116, and the expected value comparator 116 compares the response signal received from the signal receiver 114 against the expected value received from the test signal generator 112 to judge whether the device under test 10 is acceptable (step S250).

When judging that an optical test is to be performed, the test apparatus 100 controls the first optical switch 140 to connect the electric-photo converter 120 to the optical interface 152 and controls the second optical switch 180 to connect the optical interface 152 to the photo-electric converter 160. The test apparatus 100 uses the electric-photo converter 120 to convert the test signal generated by the test signal generator 112 into an optical test signal and supplies the optical test signal to the optical receiver 12 (step S260). The test signal generator 112 sends to the expected value comparator 116 the expected value corresponding to the supplied test signal.

The test apparatus 100 uses the photo-electric converter 160 to convert the optical response signal output from the optical transmitter 14 of the device under test 10 in response to the supplied optical test signal into an electrical response signal and receives the electrical response signal at the signal receiver 114 (step S270). The signal receiver 114 sends the received response signal to the expected value comparator 116, and the expected value comparator 116 compares the response signal received from the signal receiver 114 against the expected value received from the test signal generator 112 to judge whether the device under test 10 is acceptable (step S250).

The test apparatus 100 repeatedly performs the steps from S220 to S250 until completing the test to perform (step S280). In this way, the test apparatus 100 can perform an optical test using an optical test signal on the device under test 10. Also, the test apparatus 100 can perform, on the device under test 10, a test including both an optical test based on an optical test signal and an electrical test based on an electrical signal. The test apparatus 100 can exchange optical signals and electrical signals independently from each other. Therefore, when the device under test 10 outputs both electrical and optical response signals in response to optical test signals, the test apparatus 100 can receive the electrical response signals and the optical response signals independently from each other. When the device under test 10 outputs both electrical and optical response signals in response to electrical test signals, the test apparatus 100 can also receive the electrical response signals and the optical response signals independently from each other. When the device under test 10 receives en electrical signal from a different apparatus than the test apparatus 100 or does not require an electrical signal, the test apparatus 100 may be required to connect the device under test 10 only to the optical interface 152 to perform an optical test.

To perform a test on the device under test 10, the test apparatus 100 may transmit and/or receive high-speed test and/or response signals in the form of optical signals and transmit and/or receive low-speed clock, test, response, and/or power signals in the form of electrical signals. Thus, the test apparatus 100 transmits, in the form of optical signals, high-frequency signals that are difficult to be transmitted in the form of electrical signals and have, for example, a frequency of several hundred MHz or higher. Consequently, the test apparatus 100 can exchange test and response signals with the device under test 10 at high speed. Additionally, the test apparatus 100 can test the device under test 10 operating at an actual operation speed, for example.

The test apparatus 100 requires at least two optical switches, the optical signal generator 130, and the optical monitoring section 170 to detect whether there is connection between the device under test 10 and the optical interface 152. As described above, the test apparatus 100 can perform a test at high speed and detect whether the device under test 10 is connected. Consequently, the test apparatus 100 can achieve a higher test throughput.

Figure 3:
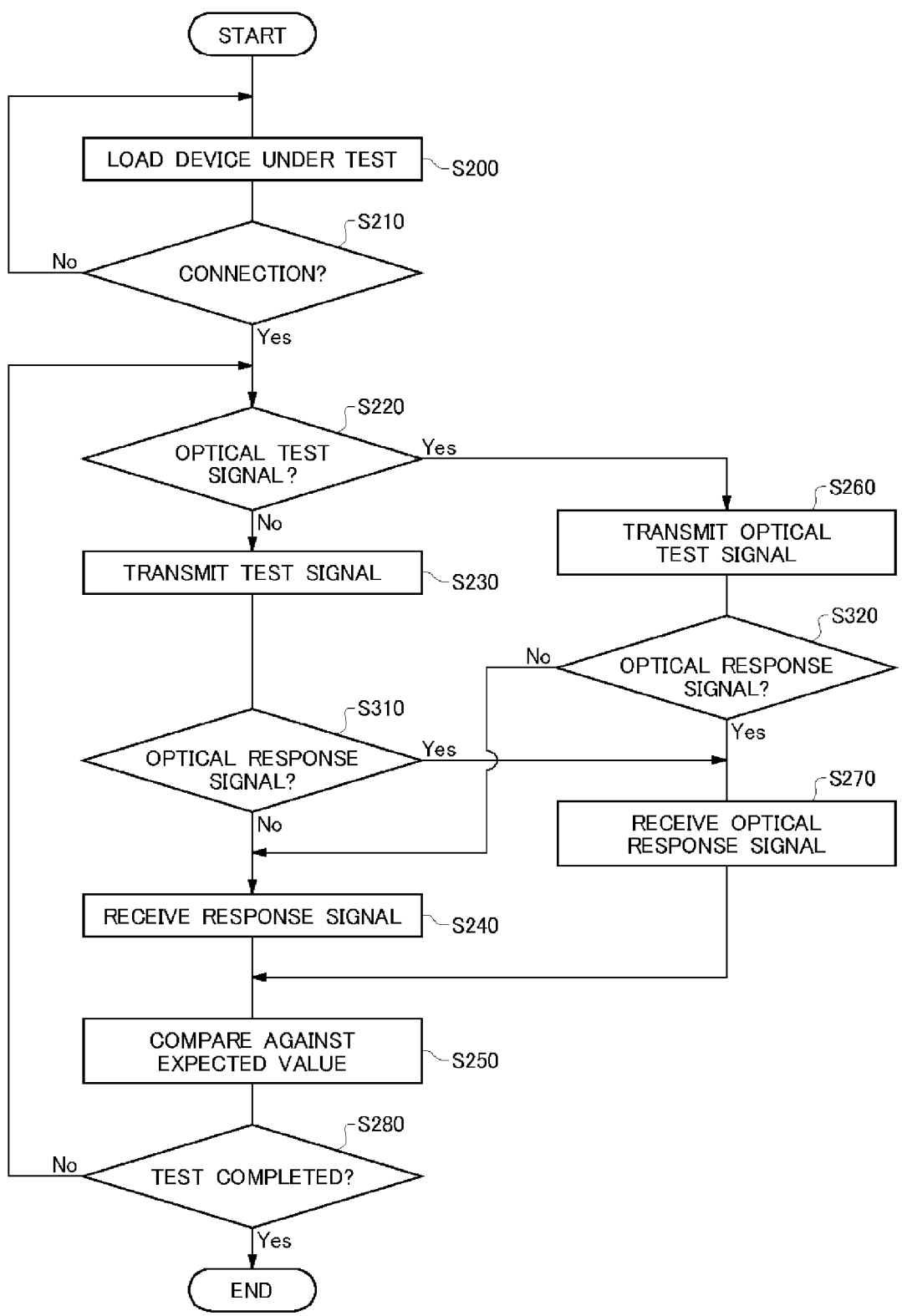
FIG. 3 is a flow chart to illustrate exemplary modified operations of the test apparatus 100 relating to the embodiment.

FIG. 3 is a flow chart to illustrate exemplary modified operations of the test apparatus 100 relating to the embodiment. The present modification example includes substantially the same operations as the embodiment shown in FIG. 2, and such common operations are designated by the same reference numerals and not explained in the following. According to the present modification example, the test apparatus 100 can perform tests corresponding to the cases where the device under test 10 outputs electrical signals in response to optical signals input thereto or output optical response signals in response to electrical signals input thereto.

On detection of normal connection between the device under test 10 and the device interface 150 in the step S210, the test apparatus 100 starts testing the device under test 10. The test apparatus 100 determines whether an electrical or optical test signal should be used (step S220). When determining that an electrical test signal is to be used, the test apparatus 100 supplies the test signal generated by the test signal generator 112 to the input terminal 16 via the output terminal 158 (Step S230). Here, the test signal generator 112 sends to the expected value comparator 116 the expected value corresponding to the supplied test signal.

Subsequently, the test apparatus 100 determines whether the device under test 10 outputs an electrical or optical response signal in response to the test signal (step S310). For example, the test apparatus 100 determines whether the device under test 10 outputs an electrical or optical response signal in response to the test signal by referring to a test program, a test sequence, or a control command. Alternatively, the test apparatus 100 may know in advance whether the device under test 10 outputs an electrical or optical response signal in response to the test signal.

When determining that the device under test 10 outputs an electrical response signal, the test apparatus 100 receives the response signal output from the output terminal 18 at the signal receiver 114 via the input terminal 159, similarly to the example shown in FIG. 2 (step S240). The signal receiver 114 sends the received response signal to the expected value comparator 116, and the expected value comparator 116 compares the value of the response signal received from the signal receiver 114 against the expected value received from the test signal generator 112 to judge whether the device under test 10 is acceptable (step S250).

On the other hand, when determining that the device under test 10 outputs an optical response signal, the test apparatus 100 uses the photo-electric converter 160 to convert the optical response signal output from the optical transmitter 14 into an electrical response signal and receives the electrical response signal at the signal receiver 114 (step S270). The signal receiver 114 sends the received response signal to the expected value comparator 116, and the expected value comparator 116 compares the value of the response signal received from the signal receiver 114 against the expected value received from the test signal generator 112 to judge whether the device under test 10 is acceptable (step S250).

When determining that an optical test signal is to be used, the test apparatus 100 uses the electric-photo converter 120 to convert the test signal generated by the test signal generator 112 into an optical test signal and supplies the optical test signal to the optical receiver 12 (step S260). Here, the test signal generator 112 sends to the expected value comparator 116 the expected value corresponding to the supplied test signal.

Subsequently, the test apparatus 100 determines whether the device under test 10 outputs an electrical or optical response signal in response to the optical test signal (step S320). For example, the test apparatus 100 determines whether the device under test 10 outputs an electrical or optical response signal in response to the optical test signal by referring to a test program, a test sequence, or a control command. Alternatively, the test apparatus 100 may know in advance whether the device under test 10 outputs an electrical or optical response signal in response to the optical test signal.

When determining that the device under test 10 outputs an optical response signal, the test apparatus 100 uses the photo-electric converter 160 to convert the optical response signal output from the optical transmitter 14 into an electrical response signal and receives the electrical response signal at the signal receiver 114, similarly to the example shown in FIG. 2 (step S270). The signal receiver 114 sends the received response signal to the expected value comparator 116, and the expected value comparator 116 compares the value of the response signal received from the signal receiver 114 against the expected value received from the test signal generator 112 to judge whether the device under test 10 is acceptable (step S250).

On the other hand, when determining that the device under test 10 outputs an electrical response signal, the test apparatus 100 receives the response signal output from the output terminal 18 at the signal receiver 114 via the input terminal 159 (step S240). The signal receiver 114 sends the received response signal to the expected value comparator 116, and the expected value comparator 116 compares the value of the response signal received from the signal receiver 114 against the expected value received from the test signal generator 112 to judge whether the device under test 10 is acceptable (step S250).

According to the above-described modification example, the test apparatus 100 can perform tests corresponding to the cases where the device under test 10 outputs an electrical signal in response to an optical signal input thereto or outputs an optical response signal in response to an electrical signal input thereto. Furthermore, the test apparatus 100 can perform tests on the device under test 10 even when the device under test 10 has the optical receiver 12 but does not have the optical transmitter 14, or has the optical transmitter 14 but does not have the optical receiver 12.

Figure 4:
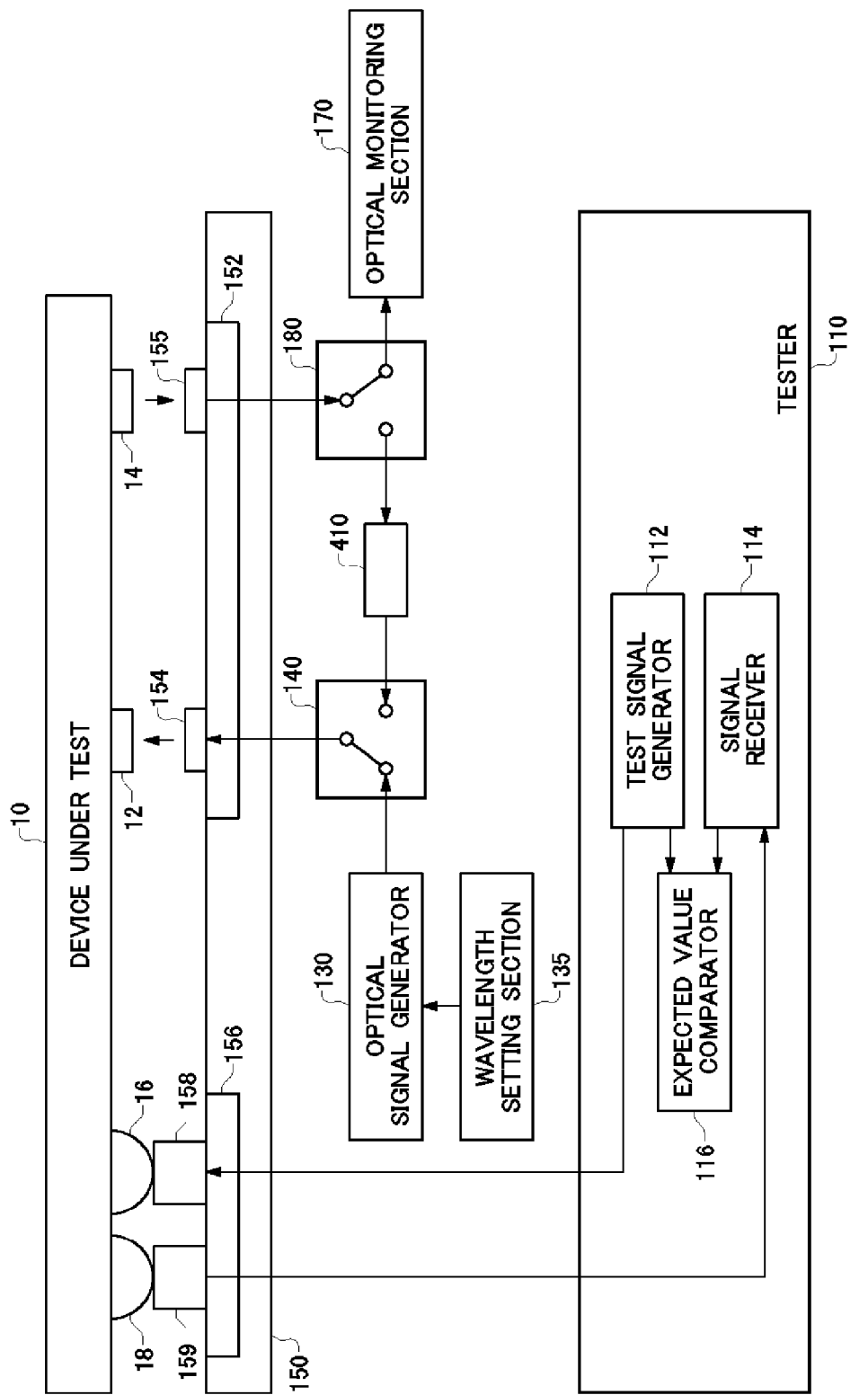
FIG. 4 illustrates a first modification example of the test apparatus 100 relating to the embodiment, together with the device under test 10.

FIG. 4 illustrates a first modification example of the test apparatus 100 relating to the embodiment, together with the device under test 10. The test apparatus 100 relating to the present modification example has substantially the same components as the test apparatus 100 relating to the embodiment shown in FIG. 1, and such common components are designated by the same reference numerals and not described here. The test apparatus 100 relating to the present modification example performs an optical loopback test on the device under test 10. The test apparatus 100 relating to the present modification example includes a loopback optical path 410.

The loopback optical path 410 loops an optical response signal from the device under test 10 back to the device under test 10. For example, the loopback optical path 410 is an optical transmission path such as an optical fiber or optical waveguide and connects the optical transmitter 14 and the optical receiver 12 of the device under test 10 to each other. The loopback optical path 410 includes a device corresponding to what to be tested.

For example, the loopback optical path 410 has a phase controller that controls the phase timing of the optical signal transmitted therethrough. The phase controller may be an optical phase modulator that controls the phase of light transmitted therethrough based on a change in refractive index that is caused by applying an electric field to an electric optical crystal such as ferroelectric crystal. Alternatively, the phase controller may be an optical phase modulator that controls the phase of the light transmitted therethrough by applying an electric field to a Mach-Zehnder waveguide. Alternatively, the phase controller may be an optical phase modulator that controls the phase of the light transmitted therethrough based on a change in fiber length that is caused by applying a physical force to the optical fiber transmitting the optical signal therethrough.

The phase controller varies the phase timing of the optical signal transmitted therethrough to control the skew of the optical signal that is looped back and input into the device under test 10. In other words, having the phase controller in the loopback optical path 410, the test apparatus 100 can perform a skew tolerance test or the like on the device under test 10. The phase controller varies the phase timing of the optical signal transmitted therethrough to control the jitter of the optical signal that is looped back and input into the device under test 10. In other words, having the phase controller in the loopback optical path 410, the test apparatus 100 can perform a jitter tolerance test or the like on the device under test 10.

For example, the loopback optical path 410 has an attenuator that attenuates the intensity of the optical signal transmitted therethrough. The attenuator is desirably of a variable type that can control how much attenuation it achieves. The attenuator varies the attenuation of the optical signal transmitted therethrough to control the intensity of the optical signal that is looped back and input into the device under test 10. In other words, having the attenuator in the loopback optical path 410, the test apparatus 100 can perform an optical intensity attenuation tolerance test or the like on the device under test 10. The test apparatus 100 can obtain a shmoo plot for a optical test by performing a combination of a skew tolerance tests and an optical intensity attenuation tolerance test on the device under test 10.

The loopback optical path 410 may be an optical transmission path that connects the optical transmitter 14 and the optical receiver 12 of the device under test 10 to each other. In this case, the test apparatus 100 can test the design for test (DFT) function of the device under test 10 by causing the device under test 10 to generate a pseudorandom binary (bit) sequence (PRBS) signal.

The first optical switch 140 receives optical signals output from the loopback optical path 410 and the optical signal generator 130, selects one of the optical signals, and outputs the selected optical signal to the optical interface 152. The second optical switch 180 selects one of the loopback optical path 410 and the optical monitoring section 170 and allows the optical signal received from the optical interface 152 to be input into the selected one of the loopback optical path 410 and the optical monitoring section 170.

Figure 5:
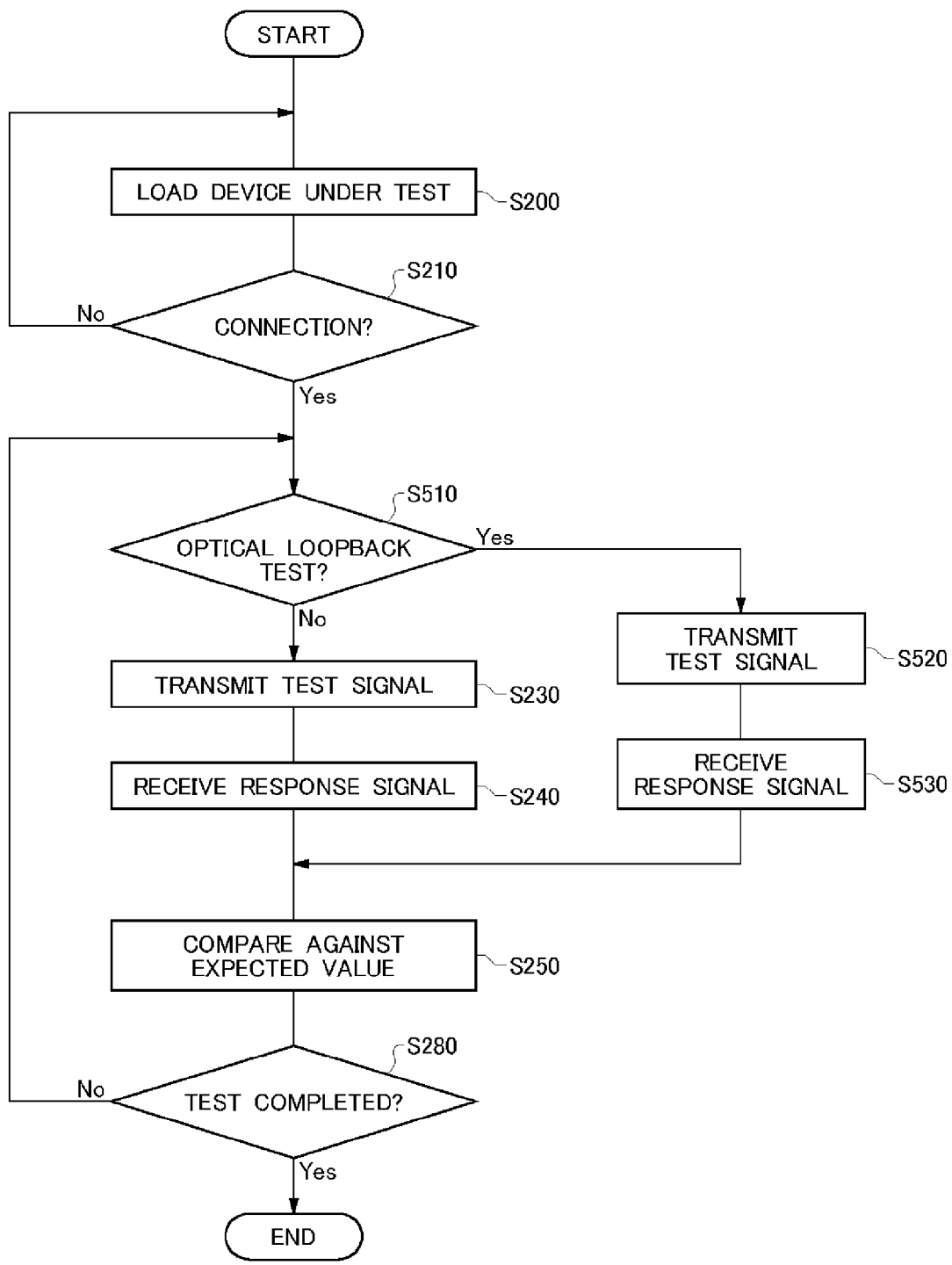
FIG. 5 is a flow chart to illustrate the operations of the first modification example of the test apparatus 100 relating to the embodiment.

FIG. 5 is a flow chart to illustrate the operations of the first modification example of the test apparatus 100 relating to the embodiment. The flow of operations shown in FIG. 5 includes substantially the same operations as the flow of operations shown in FIG. 2, and such common operations are designated by the same reference numerals and not explained in the following.

The test apparatus 100 starts testing the device under test 10 once normal connection is detected between the device under test 10 and the device interface 150 in the step S210. The test apparatus 100 determines whether to perform an optical loopback test or an electrical test (step S510). When determining that an electrical test is to be performed, the test apparatus 100 supplies a test signal to the device under test 10, receives a response signal output from the device under test 10 in response to the test signal, and compares the value of the response signal against an expected value to judge whether the device under test 10 is acceptable, as in the steps S230 to S250 shown in FIG. 2.

When determining that an optical loopback test is to be performed, the test apparatus 100 controls the first optical switch 140 to output the optical signal output from the loopback optical path 410 to the optical interface 152 and controls the second optical switch 180 to input the optical response signal from the optical interface 152 to the loopback optical path 410. The test apparatus 100 supplies the test signal generated by the test signal generator 112 to the input terminal 16 via the output terminal 158 (step S520).

Here, the test signal generated by the test signal generator 112 is, for example, a control command to cause the device under test 10 to start a loopback test and/or a test pattern used to perform an optical loopback test. The test signal generator 112 sends the expected value corresponding to the started optical loopback test to the expected value comparator 116. The device under test 10 starts an optical loopback test in response to receiving the test signal from the test apparatus 100 via the input terminal 16 and outputs the result of the test via the output terminal 18 in the form of a response signal.

The test apparatus 100 receives the response signal output from the device under test 10 via the output terminal 18 at the signal receiver 114 via the input terminal 159 (step S530). The signal receiver 114 sends the received response signal to the expected value comparator 116, and the expected value comparator 116 compares the value of the response signal received from the signal receiver 114 against the expected value received from the test signal generator 112 to judge whether the device under test 10 is acceptable (step S250). The test apparatus 100 repeatedly performs the steps S510 to S250 until completing the tests to be performed (step S280). In this way, the test apparatus 100 can perform an optical loopback test on the device under test 10.

According to the above-described modification example, the test apparatus 100 exchanges electrical signals with the device under test 10 to start an optical loopback test and receive a response signal. As an alternative example, when the device under test 10 has one or more optical receivers to receive a control signal and/or one or more optical transmitters to transmit an optical response signal, the test apparatus 100 exchanges optical signals to start an optical loopback test and/or to receive an optical response signal. For example, the test apparatus 100 includes another pair of an optical signal generator 130 and an optical monitoring section 170 to transmit an optical signal to the control signal optical receiver of the device under test 10 to start an optical loopback test and to receive an optical response signal from the device under test 10.

In this case, the optical signal generator 130 that is connected to the control signal optical receiver of the device under test 10 generates an optical control signal including a control signal to start an optical loopback test in addition to an optical signal used to detect whether there is connection between the device under test 10 and the optical interface 152. The optical monitoring section 170 that is connected to the optical response signal optical transmitter of the device under test 10 monitors an optical response signal in addition to performing operations to detect whether there is connection between the device under test 10 and the optical interface 152. With such a configuration, the test apparatus 100 can perform an optical loopback test on the device under test 10 using optical control signals.

Figure 6:
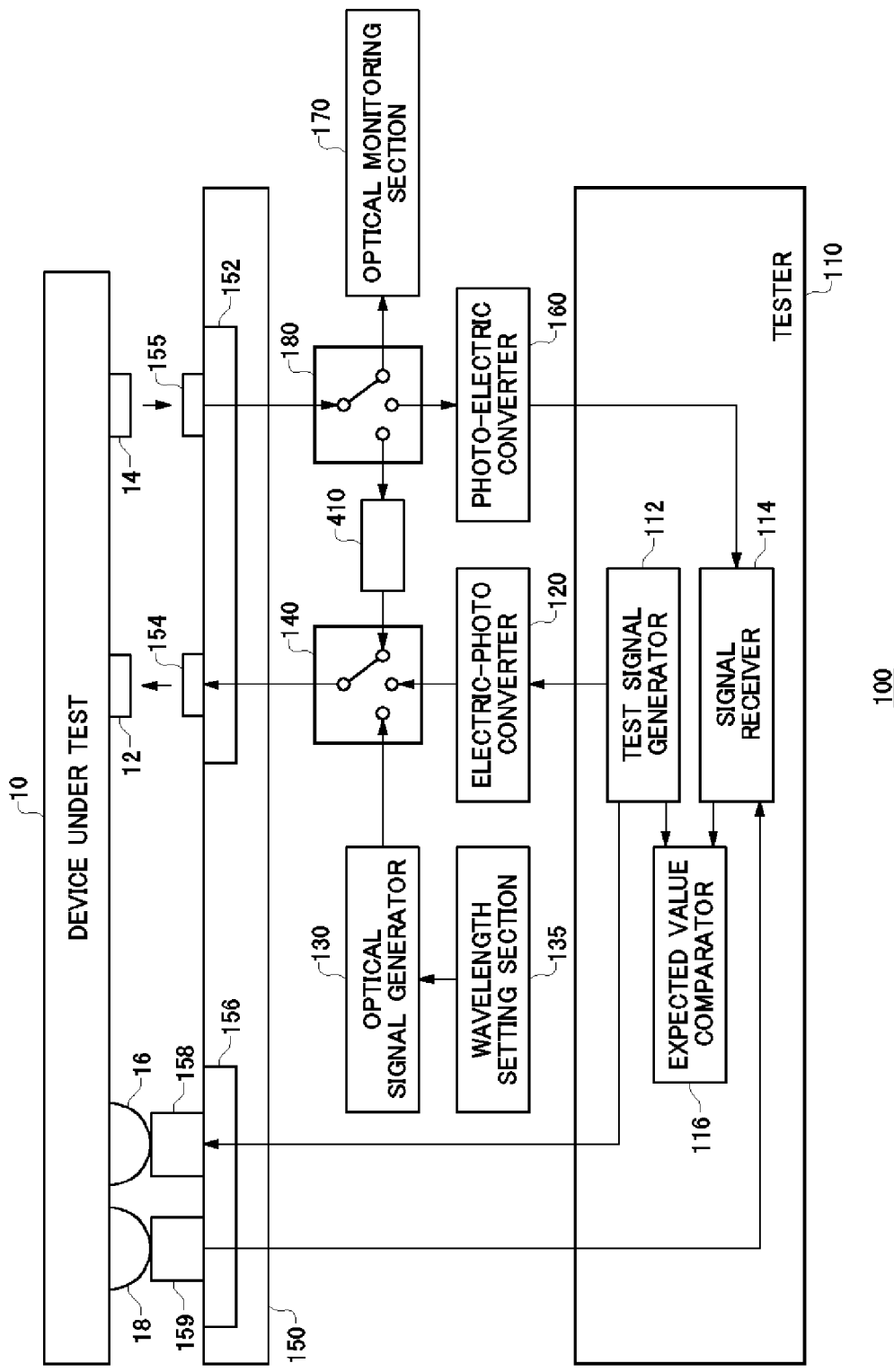
FIG. 6 illustrates a second modification example of the test apparatus 100 relating to the embodiment, together with the device under test 10.

FIG. 6 illustrates a second modification example of the test apparatus 100 relating to the embodiment, together with the device under test 10. The test apparatus 100 relating to the present modification example has substantially the same components as the test apparatus 100 relating to the embodiment shown in FIG. 1 and the test apparatus 100 relating to the first modification example shown in FIG. 4, and such common components are designated by the same reference numerals and not described here. The test apparatus 100 relating to the present modification example performs an electrical test, an optical test, and an optical loopback test on the device under test 10.

The first optical switch 140 receives the optical signals output from the optical signal generator 130, the loopback optical path 410, and the electric-photo converter 120, selects one of the optical signals and allows the selected optical signal to be input into the optical interface 152. The second optical switch 180 selects one of the optical monitoring section 170, the loopback optical path 410, and the photo-electric converter 160 and allows the optical response signal from the optical interface 152 to be input into the selected one of the optical monitoring section 170, the loopback optical path 410, and the photo-electric converter 160.

To detect whether there is connection between the device under test 10 and the optical interface 152, the test apparatus 100 controls the first optical switch 140 to allow the optical signal output from the optical signal generator 130 to be input into the optical interface 152. Furthermore, the test apparatus 100 controls the second optical switch 180 to allow the optical response signal from the optical interface 152 to be input into the optical monitoring section 170. The test apparatus 100 can detect whether there is connection between the device under test 10 and the device interface 150 by performing substantially the same operation as the step S210 described in the above exemplary embodiment.

To perform an optical test using an optical test signal, the test apparatus 100 controls the first optical switch 140 to allow the optical test signal output from the electric-photo converter 120 to be input into the optical interface 152. Furthermore, the test apparatus 100 controls the second optical switch 180 to allow the optical response signal from the optical interface 152 to be input into the photo-electric converter 160. The test apparatus 100 relating to the present modification example can perform an optical test on the device under test 10 by performing substantially the same flow of operations as the flow of operations of the test apparatus 100 relating to the embodiment shown in FIG. 2 or 3.

To perform an optical loopback test, the test apparatus 100 controls the first optical switch 140 to allow the optical signal output from the loopback optical path 410 to be input into the optical interface 152. Furthermore, the test apparatus 100 controls the second optical switch 180 to allow the optical response signal from the optical interface 152 to be input into the loopback optical path 410. The test apparatus 100 relating to the present modification example can perform an optical loopback test on the device under test 10 by performing substantially the same flow of operations as the flow of operations of the test apparatus 100 relating to first modification example shown in FIG. 5.

According to the above-described exemplary embodiment, the electric-photo converter 120 converts a single test signal into an optical test signal having a corresponding single wavelength and transmits the optical test signal through a single optical transmission path to a single optical receiver 12. Alternatively, the electric-photo converter 120 may convert a plurality of test signals into an optical test signal having a plurality of corresponding wavelengths and transmit the optical test signal through a single optical transmission path to a single optical receiver 12. In other words, the electric-photo converter 120 converts a plurality of test signals into a plurality of optical test signals respectively having a plurality of corresponding wavelengths, multiplexes the optical test signals, and supplies the resulting wavelength-multiplexed optical test signal to the device under test 10.

In the above-described exemplary embodiment, the photo-electric converter 160 converts an optical response signal having a single wavelength transmitted through a single optical transmission path from a single optical transmitter 14, into a corresponding single response signal. Alternatively, the photo-electric converter 160 may convert an optical response signal having a plurality of wavelengths transmitted through a single optical transmission path from a single optical transmitter 14 into a plurality of corresponding response signals. In other words, the photo-electric converter 160 splits and then photo-electric converts a wavelength-multiplexed optical response signal received from the device under test 10 into a plurality of response signals corresponding to a plurality of test signals.

In this case, the device under test 10 receives a wavelength-multiplexed optical test signal, splits the optical test signal within the device under test 10, and distributes the resulting optical test signals to a plurality of optical circuits to be tested, for example. The device under test 10 multiplexes a plurality of response signals from the plurality of optical circuits into a wavelength-multiplexed optical response signal and outputs the wavelength-multiplexed optical response signal from the optical transmitter 14. In this way, the test apparatus 100 can supply a plurality of optical test signals to the device under test 10 through a single optical transmission path and receive a plurality of optical response signals through a single transmission path. Consequently, the test apparatus 100 can simultaneously perform a plurality of optical tests on the device under test 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. A test apparatus for testing a device under test, comprising:
   a test signal generator that generates a test signal to test the device under test;
   an electric-photo converter that converts the test signal into an optical test signal;
   an optical interface that (i) transmits the optical test signal generated by the electric-photo converter to an optical receiver of the device under test and (ii) receives and outputs an optical response signal output from the device under test;
   a photo-electric converter that converts the optical response signal output from the optical interface into an electrical response signal and transmits the electrical response signal;
   a signal receiver that receives the response signal transmitted from the photo-electric converter,
   an optical signal generator that generates an optical signal;
   a first optical switch that receives optical signals output from the optical signal generator and the electric-photo converter, selects one of the optical signals, and allows the selected optical signal to be input into the optical interface and transmitted by the optical interface to the optical receiver of the device under test;
   an optical monitoring section that converts an input optical signal into an electrical signal to monitor the optical signal, and
   a second optical switch that selects one of the optical monitoring section and the photo-electric converter and allows the optical response signal output front the optical interface to be input into the selected one of the optical monitoring, section and the photo-electric converter.

2. The test apparatus as set forth in claim 1, wherein the optical signal generator includes a variable wavelength light source that varies a wavelength of light output therefrom.

3. The test apparatus as set forth in claim 2, further comprising a wavelength setting section that sets the wavelength of the light output from the variable wavelength light source, in accordance with a wavelength of an optical signal to be received by the device under test.

4. The test apparatus as set forth in claim 1, wherein the first optical switch selects the optical signal output from the optical signal generator and allows the selected optical signal to be input, into the optical interface,
   the second optical switch selects the optical monitoring section and allows the optical response signal output from the optical interface to be input into the selected optical monitoring section, and
   the test apparatus detects whether connection exists between the device under test and the optical interface based on a result of the monitoring done by the optical monitoring section and starts testing the device under test in response to detection of the connection.

5. The test apparatus as set forth in claim 1, further comprising an electrical interface that establishes electrical connection with the device under test and exchanges electrical signals with the device under test, wherein
   the electrical interface (i) receives a test signal from the test signal generator and supplies the received test signal to the device under test and (ii) receives a response signal output from the device under test in response to the test signal and transmits the received response signal to the signal receiver.

6. The test apparatus as set forth in claim 1, wherein
   the electric-photo converter converts a plurality of test signals into optical test signals respectively having corresponding wavelengths, multiplexes the optical test signals into a wavelength-multiplexed optical test signal, and supplies the wavelength-multiplexed optical test signal to the device under test, and
   the photo-electric converter receives a wavelength-multiplexed optical response signal from the device under test, splits the wavelength-multiplexed optical response signal into a plurality of optical response signals and photo-electric converts the plurality of optical response signals into a plurality of response signals corresponding to the plurality of test signals.

7. The test apparatus according to claim 1, wherein
   the electric-photo converter converts a plurality of test signals into optical test signals respectively having corresponding wavelengths and supplies the plurality of optical test signals to the device under test, and
   the photo-electric converter receives a plurality of optical response signals from the device under test and photo-electric converts the plurality of optical response signals into a plurality of response signals corresponding to the plurality of test signals.

8. A test apparatus for testing a device under test, comprising:
   an optical signal generator that generates an optical signal;
   an optical interface that (i) transmits the optical signal to an optical receiver of the device under test and (ii) receives and outputs an optical response signal output from the device under test;
   an optical monitoring section that converts an input optical signal into an electrical signal to monitor the optical signal;
   a loopback optical path that loops the optical response signal from the device under test back to the device under test,
   a first optical switch that receives optical signals output from the loopback optical path and the optical signal generator, selects one of the optical signals, and outputs the selected optical signal to be input into the optical interface and transmitted by the optical interface to the optical receiver of the device under test; and
   a second optical switch that selects one of the loopback optical path and the optical monitoring section and allows an input optical signal to be input into the selected one of the loopback optical path and the optical monitoring section, wherein
   the optical interface allows the optical signal output from the first optical switch to be input into the optical receiver of the device under test and allows the optical response signal output from the device under test to be input into the second optical switch.

9. The test apparatus as set forth in claim 8, further comprising:
   a test signal generator that generates a test signal to test the device under test;
   a signal receiver that receives a response signal output from the device under test in response to the test signal; and
   an electrical interface that establishes electrical connection with the device under test and exchanges electrical signals, wherein
   the electrical interface (i) receives the test signal from the test signal generator and supplies the received test signal to the device under test, and (ii) receives the response signal output from the device under test in response to the test signal and transmits the received response signal to the signal receiver.

10. The test apparatus as set forth in claim 8, further comprising:
a test signal generator that generates a test signal to test the device under test;
a signal receiver that receives a response signal output from the device under test in response to the test signal;
an electric-photo converter that converts the test signal into an optical test signal; and
a photo-electric converter that converts an input optical signal into an electrical signal and transmits the electrical signal to the signal receiver, wherein
the first optical switch receives optical signals output from the optical signal generator, the loopback optical path, and the electric-photo converter, selects one of the optical signals, and allows the selected optical signal to be input into the optical interface, and
the second optical switch selects one of the optical monitoring section, the loopback optical path, and the photo-electric converter and allows the optical response signal from the optical interface to be input into the selected, one of the optical monitoring section, the loopback optical path, and the photo-electric converter.

11. The test apparatus as set forth in claim 10, further comprising an electrical interface that establishes electrical connection with the device under test and exchanges electrical signals with the device under test, wherein
the electrical interface (i) receives a test signal from the test signal generator and supplies the received test signal to the device under test and (ii) receives a response signal output from the device under test in response to the test signal and transmits the received response signal to the signal receiver.

12. The test apparatus as set forth in claim 8, wherein
the loopback optical path includes a phase controller that controls a phase timing of art optical signal transmitted therethrough.

13. The test apparatus as set forth in claim 8, wherein
the optical signal generator includes a variable wavelength light source that varies a wavelength of light output therefrom.

14. The test apparatus as set forth in claim 13, further comprising a wavelength setting, section that sets the wavelength of the light output from the variable wavelength light source, in accordance with a wavelength of an optical signal to be received by the device under test.

15. The test apparatus as set forth in claim 8, wherein
the first optical switch selects the optical signal output from the optical signal generator and allows the selected optical signal to be input into the optical interface, the second optical switch selects the optical monitoring section and allows the optical response signal output from the optical interface to be input into the selected optical monitoring section, and
the test apparatus detects whether connection exists between the device under test and the optical interface based on a result of the monitoring done by the optical monitoring section and starts testing the device under test in response to detection of the connection.

16. A test method for testing a device under test using a test apparatus, comprising:
generating an optical signal:
(i) transmitting the optical signal to an optical receiver of the device under test and (ii) receiving, and outputting a first optical response signal output from the device under test;
detecting whether connection exists between the test apparatus and the device under test based on the first optical response signal;
generating a test signal to test the device under test;
electric-photo converting the test signal into an optical test signal;
(i) transmitting the optical test signal to the optical receiver of the device under test and (ii) receiving and outputting a second optical response signal output from the device under test;
photo-electric, converting the second optical response signal into an electrical response signal; and
judging whether the device under test is acceptable based on the electrical response signal.

17. The test method according to claim 16, wherein
said transmitting the optical signal, said receiving and outputting the first optical response signal, said transmitting the optical test signal, and said receiving and outputting the second optical response signal are performed by an optical interface of the test apparatus,
said detecting is performed by an optical monitoring section of the test apparatus, and
the test method further comprises:
switching, by a first optical switch, between connecting the optical interface to i) an optical signal generator for generating the optical signal and ii) an electro-photo converter for electric-photo converting the test signal into the optical test signal; and
switching, by a second optical switch, between connecting the optical interface to i) the optical monitoring section and ii) a photo-electric converter for photo-electric converting the second optical response signal into the electrical response signal.

* * * * *